United States Patent
Vinther et al.

(10) Patent No.: US 6,396,293 B1
(45) Date of Patent: May 28, 2002

(54) SELF-CLOSING SPRING PROBE

(75) Inventors: Gordon A. Vinther, Pasadena; Scott D. Chabineau, Pomona; Charles J. Johnston, Walnut, all of CA (US)

(73) Assignee: Delaware Capital Formation, Inc., Wilmington, DE (US)

( * ) Notice: Subject to any disclaimer, the term of this patent is extended or adjusted under 35 U.S.C. 154(b) by 0 days.

(21) Appl. No.: 09/253,320

(22) Filed: Feb. 18, 1999

(51) Int. Cl.⁷ .............................................. G01R 31/02
(52) U.S. Cl. ...................................................... 324/761
(58) Field of Search ................................ 324/761, 754, 324/755, 757, 758, 762, 765; 439/482, 700, 824

(56) References Cited

U.S. PATENT DOCUMENTS

| | | | |
|---|---|---|---|
| 3,754,731 A | * 8/1973 | Mackal et al. | 251/145 |
| 4,438,397 A | * 3/1984 | Katz | 324/761 |
| 4,701,700 A | 10/1987 | Jenkins | 324/158 F |
| 4,740,746 A | 4/1988 | Pollock et al. | 324/158 P |
| 4,897,043 A | * 1/1990 | Giringer et al. | 439/482 |
| 4,904,213 A | 2/1990 | Hock et al. | 439/824 |
| 4,935,695 A | 6/1990 | Hayes et al. | 324/158 F |
| 5,174,763 A | 12/1992 | Wilson | 439/66 |
| 5,410,260 A | 4/1995 | Kazama | 324/758 |
| 5,746,606 A | * 5/1998 | Sobhani | 439/21 |
| 6,104,205 A | * 8/2000 | Mawby | 324/761 |

FOREIGN PATENT DOCUMENTS

| | | |
|---|---|---|
| EP | 0 616 394 | 9/1994 |
| FR | 2 224 757 | 10/1974 |
| GB | 1324053 | 7/1973 |
| JP | 62-12875 | 1/1987 |
| JP | 4-270967 | 4/1992 |

OTHER PUBLICATIONS

Udall, Gordon F., Specifying test fixtures for Automated Test Equipment, Instruments & Control Systems, pp. 63–66, vol. 55 (1982) Oct., No. 10, Radnor, Pennsylvania, USA.

Visual Inspection of Oztek .5mm Probe, Everett Charles Technologies Contact Products Division, Jun. 21, 2000 (1 page).

* cited by examiner

Primary Examiner—Safet Metjahic
Assistant Examiner—Russell M. Kobert
(74) Attorney, Agent, or Firm—Christie, Parker & Hale, LLP

(57) ABSTRACT

An external spring probe is provided having a first section and a second section which extend and compress relative to each other. The first section consists of a tip at one end and a first contact component opposite the tip. A flange extends radially outward between the tip and the first contact component. The second section consists of a tip at one end and a second contact component opposite the tip. The second contact tip is in contact with the first contact tip. A flange extends radially outward between the second section tip and the second contact component. A spring is sandwiched between the two flanges surrounding the two contact components. The first and second contact components remain in contact with each other during compression and extension of the two sections.

20 Claims, 15 Drawing Sheets

SELF-CLOSING SPRING PROBE

FIELD OF THE INVENTION

The present invention relates to electrical contact probes forming electrical interconnects and, more particularly to spring-loaded contact probes, having springs external to the electrical interconnects formed by the probes, which are used in electrical testing applications such as providing electrical contact between diagnostic or testing equipment and an electrical device such as an integrated circuit under test.

BACKGROUND OF THE INVENTION

Conventional spring-loaded contact probes generally include a movable plunger 2, a barrel 3 having an open end 4 for containing an enlarged diameter section or bearing 6 of the plunger, and a spring 5 for biasing the travel of the plunger in the barrel (FIGS. 1A and 1B). The plunger bearing 6 slidably engages the inner surface of the barrel. The enlarged bearing section is retained in the barrel by a crimp 7 near the barrel open end.

The plunger is commonly biased outwardly a selected distance by the spring and may be biased or depressed inwardly into the barrel, a selected distance, under force directed against the spring. Axial and side biasing of the plunger against the barrel prevents false opens or intermittent points of no contact between the plunger and the barrel. The plunger generally is solid and includes a head or tip 9 for contacting electrical devices under test. The barrel may also include a tip opposite the barrel's open end.

The barrel, plunger and tip(s) form an electrical interconnect between the electrical device under test aid test equipment and as such, are manufactured from an electrically conductive material. Typically the probes are fitted in cavities formed through the thickness of a test plate or socket. Generally a contact side of the electrical device to be tested, such as an integrated circuit, is brought into pressure contact with the tips of the plungers protruding through one side of the test plate or test socket for maintaining spring pressure against the electrical device. A contact plate connected to the test equipment is brought to contact with the tips of the plungers protruding through the other side of the test plate or test socket. The test equipment transmits test signals to the contact plate from where they are transmitted through the test probe interconnects to the device being tested. After the electrical device has been tested, the pressure exerted by the spring probes is released and the device is removed from contact with the tip of each probe. In conventional systems, the pressure is released by moving the electrical device and probes away from one another, thereby allowing the plungers to be displaced outwardly away from the barrel under the force of the spring, until the enlarged-diameter bearing of the plunger engages the crimp 7 on the barrel.

The process of making a conventional spring probe involves separately producing the compression spring, the barrel and the plunger. The compression spring is wound and heat treated to produce a spring of a precise size and of a controlled spring force. The plunger is typically turned on a lathe and heat treated. The barrels are also sometimes heat treated. The barrels can be formed in a lathe or by a deep draw process. All components may be subjected to a plating process to enhance conductivity. The spring probe components are assembled either manually or by an automated process.

To assemble an internal spring configuration spring probe shown in FIG. 1A, the compression spring is first placed in the barrel, the plunger bearing 6 is then inserted into the barrel to compress the spring, and the barrel is roll crimped near its open end forming crimp 7 to retain the plunger. In assembling an external spring configuration spring probe shown in FIG. 1B, the spring is placed over the plunger and rests against a flange surface 8 formed on the base of the plunger tip 9. The plunger bearing is then inserted into the barrel and the barrel is roll crimped forming crimp 7 for retaining the bearing. The spring is sandwiched between flange surface 8 and the rim 11 of the open end of the barrel. Some internal spring configuration probes consist of two plungers each having a bearing fitted in an opposite open end of a barrel. The two plungers are biased by a spring fitted in the barrel between the bearings of each plunger.

As can be seen the assembly of the probes is a multiple step process. Considering that probes are produced by the thousands, a reduction in the equipment and the steps required to produce the probes will result in substantial savings.

An important aspect of testing integrated circuit boards is that they are tested under high frequencies. As such impedance matching is required between the test equipment and integrated circuit so as to avoid attenuation of the high frequency signals. As discussed earlier, the probes are placed in cavities in a test socket. Due to the numerous probes that are used in a relatively small area in the socket, the spacing between probes is minimal making impedance matching infeasible. In such situations, in order to avoid attenuation of the high frequency signals, the length of the electrical interconnects formed by the probes must be kept to a minimum. With current probes, when the interconnect length is minimized so is the spring length and thus, spring volume.

A spring's operating life, as well as the force applied by a spring are proportional to the spring volume, i.e, the spring wire length, the diameter of the wire forming the spring, and the diameter of the spring itself. Consequently, the spring volume requirements for a given spring operating life and required spring force are in contrast with the short spring length requirements for avoiding the attenuation of the high frequency signals. For example, in internal spring configuration probes, the compressed length (also referred to herein as the "solid length") of the spring is limited by the barrel length minus the length of the plunger enlarged bearing section, minus the length of the barrel between the crimp and the barrel open end and minus the distance of plunger travel. Since the diameter of the spring is limited by the diameter of the barrel which is limited by the diameter of the cavities in the test sockets, the only way to increase the spring volume for increasing the spring operating life, as well as the spring force, is to increase the overall barrel length. Doing so, however, results in a probe having an electrical interconnect of increased length resulting in the undesirable attenuation of the high frequency signals.

Typically for a given application a given spring compliance is required. Probe spring compliance is defined by the distance of spring extension from its fully compressed position to its fully extended position in the probe. Consequently, with conventional probes the volume of the spring is limited by the required compliance. A longer spring incorporated in a conventional internal or external spring probe will reduce the plunger stroke length and thus, reduce the distance that the spring can extend from a fully compressed position. Thus, for a given probe, as the spring compliance increases, the spring volume decreases and so does the spring operating life.

An alternative type of conventional probe consists of two contact tips separated by a spring. Each contact tip is attached to a spring end. This type of probe relies on the walls of the test plate or socket cavity into which it is inserted for lateral support. The electrical path provided by this type of probe spirals down the spring wire between the two contact tips. Consequently, this probe has a relatively long electrical interconnect length which may result is attenuation of the high frequency signals when testing integrated circuits.

Thus, it is desirable to reduce the electrical interconnect length of a probe without reducing the spring volume. In addition, it is desirable to increase the spring volume without decreasing the spring compliance or increasing the electrical interconnect length. Moreover, a probe is desirable that can be easily manufactured and assembled.

SUMMARY OF THE INVENTION

An external spring probe is provided having a shorter length than conventional probes without sacrificing the probe spring operational life and compliance. Moreover, a probe is provided that can be easily manufactured and assembled. In one embodiment, the probe of the present invention consists of two separate sections each having a tip and a flange. A contact component, preferably a semi-cylindrical contact component extends from each probe section opposite the tip. The two contact components contact each other. A spring is sandwiched between the two flanges and surrounds the two contact components. Each flange can be any surface on a section of the probe which can support the spring. In an alternate embodiment, the first contact component is a barrel while the second contact component is a bearing surface. The bearing surface is slidably engaged to the inner surface of the barrel. Both of the aforementioned embodiment probes are fitted into cavities formed on test sockets or test plates which are used during testing of an electronic device. The circuit board to be tested is typically mated to one side of the socket or test plate such that the board contact points come in contact with the probe tips. A contact plate coupled to the test equipment to be used for testing the circuit board is mated to the other side of the socket or test plate and comes in contact with the second tips of the probes.

In another embodiment the probe comprises of a barrel, a plunger and a spring. The barrel has an open end for receipt of the plunger. A tip is formed on the barrel opposite of the open end. A flange extends radially from the barrel near the barrel tip. The plunger consists of a contact tip and a stem extending opposite of the contact tip. A cylindrical surface or bearing is formed at the end of the stem opposite the tip. The bearing has a diameter larger than the stem diameter. A flange also extends radially from the plunger near the plunger tip. A crimping surface is formed between the flange and the bearing.

To assemble the probe, a spring is placed over the barrel such that it rests against the barrel flange. Alternatively the spring is placed over the bearing and stem such that it rests on the plunger flange. The bearing is then slid into the barrel until the crimping surface contacts the open end of the barrel. As the plunger and barrel are further moved or compressed toward each other, the crimping surface applies a force on the open end of the barrel causing the open end to bend inward, or otherwise crimp, reducing the diameter of the barrel open end. Consequently, the bent or crimped barrel end provides a barrier for containing the bearing within the barrel. To facilitate bending or crimping of the barrel end, slits may be formed longitudinally on the barrel extending to the barrel end.

In an alternate embodiment, the barrel and/or plunger each consist of two portions. Preferably the flange and tip of the barrel form the barrel first portion while the barrel hollow portion forms the barrel's second portion. Similarly, the flange and tip of the plunger form the plunger first portion while the stem and bearing form the plunger second portion. With this embodiment, the bearing is fitted into the barrel hollow portion through the barrel open end. The barrel open end is then crimped. The spring is placed over the barrel. If a two piece barrel is used, the barrel first portion consisting of the flange and tip is then attached to the barrel second portion. If a two piece plunger is used, the plunger first portion consisting of the flange and tip is then attached to the plunger second portion.

In yet a further embodiment, slits are formed along the barrel and extend to the barrel open end diving the barrel open end into sections. At least one section is bent inward. To form the probe of this embodiment, a spring is place over the barrel or plunger bearing. The plunger bearing is then pushed into the barrel through the barrel open end causing the pre-bent section(s) to flex outward. As the bearing slides deeper into the barrel past the bent section(s), the sections flex back inward to their original pre-bent position and retain the bearing within the barrel.

DETAILED DESCRIPTION

Figure 1A:
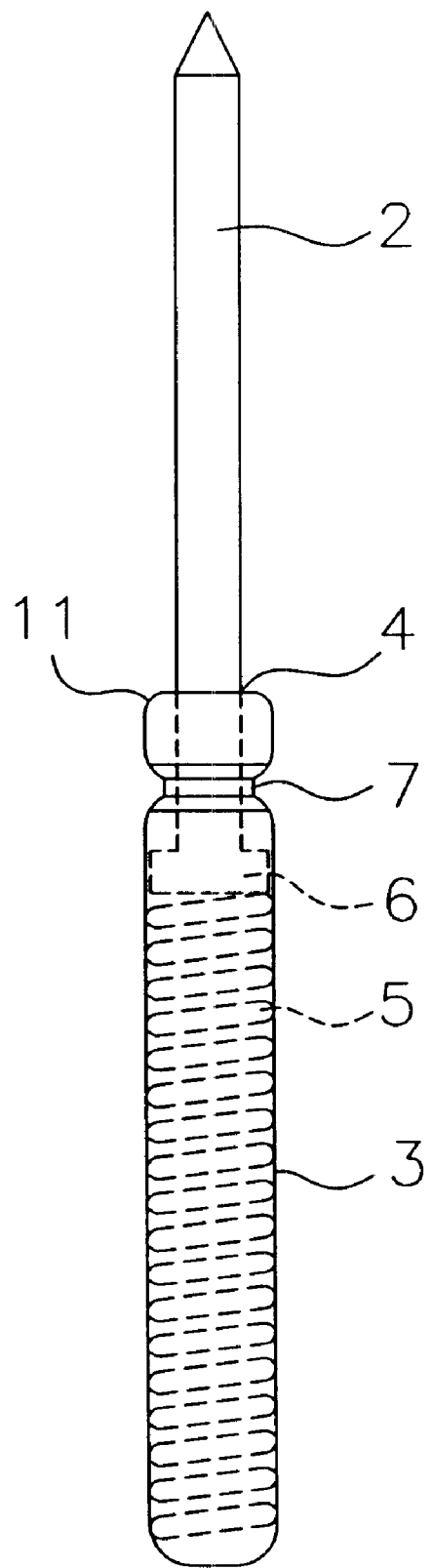
FIG. 1A is a side view a prior art probe.
Figure 1B:
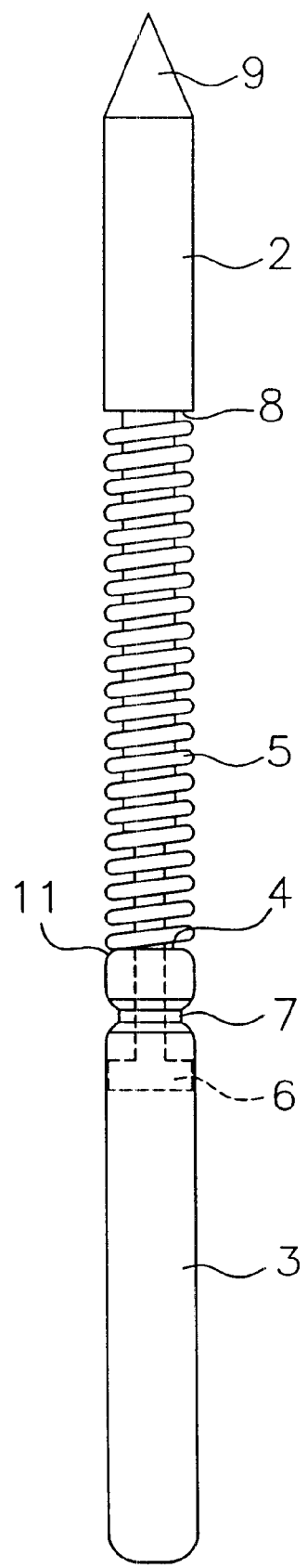
FIG. 1B is a side view a prior art probe.
Figure 2:
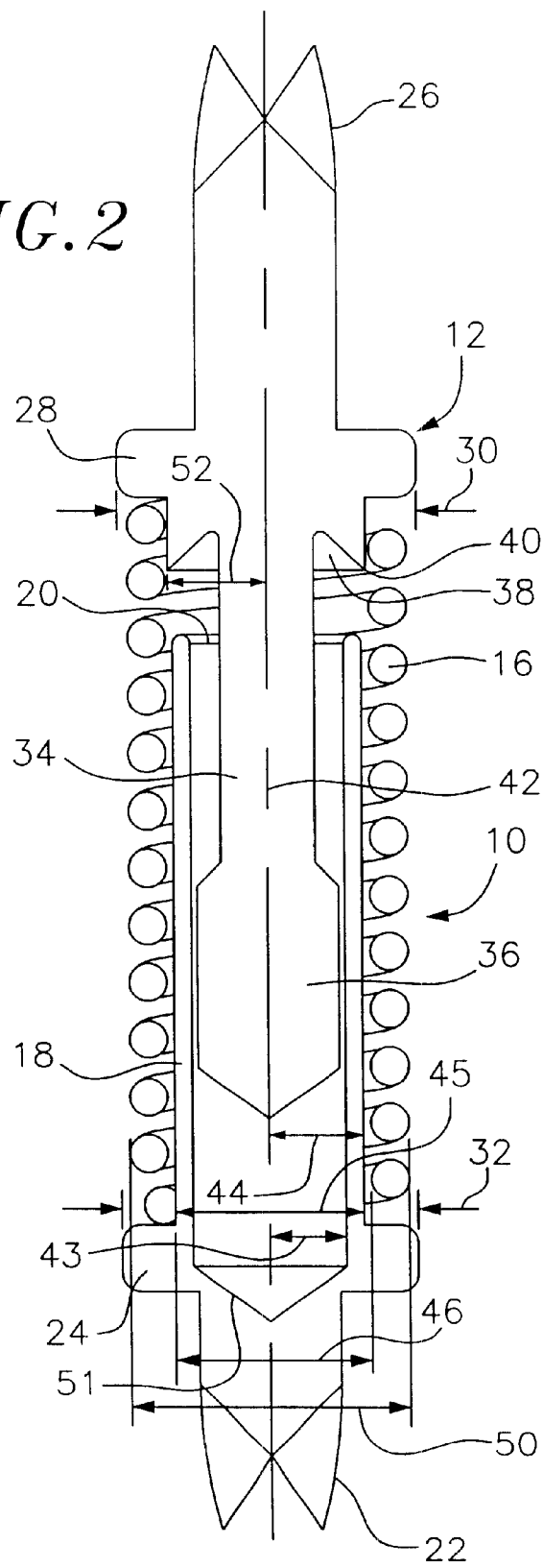
FIG. 2 is a cross-sectional view of the probe of the present invention.

Referring to FIG. 2, in one embodiment, a probe 10 of the present invention consists of a plunger 12, a barrel 18 and a spring 16. The barrel includes an open end 20. A contact tip 22 extends from the end of the barrel opposite the barrel open end. A flange 24 extends radially outward from the barrel typically at a location near the tip 22. Preferably, the barrel is made from brass and is gold plated, however, other electrically conductive materials can also be used.

The plunger also consists of a contact tip 26. A flange 28 also extends radially from a location typically at the base of the contact tip. The outer surface diameter 30 of the flange formed on the plunger is the same or similar as the outer surface diameter 32 of the flange formed on the barrel. The flanges are preferably annular.

The plunger has a stem 34 that extends axially in a direction opposite the plunger contact tip. An enlarged cylindrical surface 36 is formed at the end of the stem defining a bearing. The bearing 36 has a diameter slightly smaller than the inner surface diameter of the barrel. The bearing is preferably solid, but can also be hollow. The plunger is preferably made from BeCu and is also gold plated.

A crimping surface 38 is formed between the plunger flange and bearing. The crimping surface is used to crimp or otherwise bend inward the open end 20 of the barrel, thereby reducing the diameter of the open end. The crimping surface does not extend to the perimeter of the plunger flange. The distance between the outer edge 40 of the crimping surface and the central axis 42 of the plunger should be at least equal and preferably greater than the inner radius 43 of the barrel. Preferably, such distance should be at least as long as the outer radius 44 of the barrel.

Figure 3:
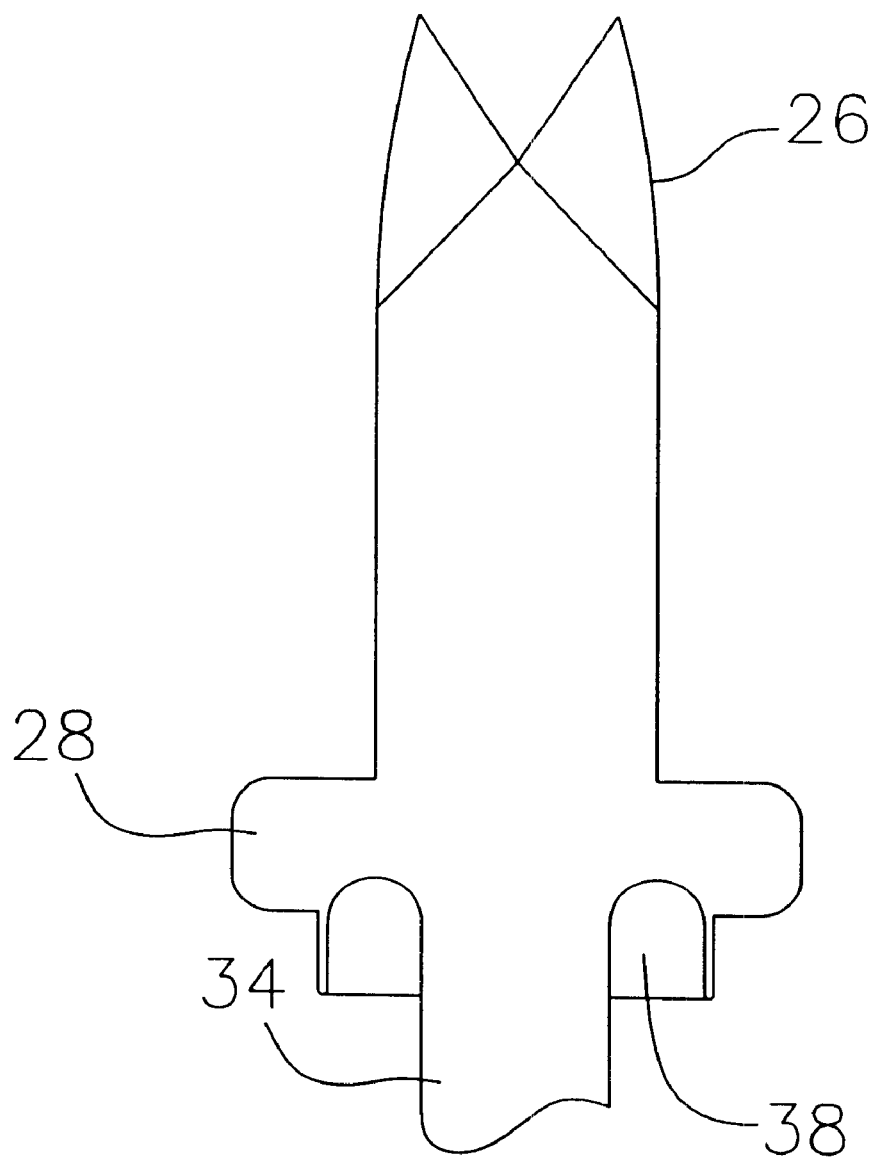
FIG. 3 is a cross-sectional view of an embodiment of the plunger of the probe of the present invention.

The crimping surface may be annular, i.e., it may span entirely around the plunger. Alternatively, the crimping surface may span only a portion of the plunger circumference. In such case, multiple crimping surfaces may be formed around the plunger. In one embodiment, shown in FIG. 2, the crimping surface is a frusto-conical surface that surrounds the stem. In another embodiment, the crimping surface is a section of a frusto conical surface (not shown). In further embodiment, the crimping surface 38 may be "U" shaped in cross-section for crimping the barrel end by causing it to curl onto itself as shown in FIG. 3.

A spring 16 having an inner diameter 46 greater than the barrel outer surface diameter 45 but not greater than the outer surface diameters 30, 32 of the flanges is fitted over the barrel and the plunger between the flanges. Preferably the spring outer diameter 50 is also not greater than the outer surface diameters 30, 32 of the flanges. The spring is preferably made of 302 stainless steel but can be made from other materials.

The spring inner radius should be longer than the distance 52 between the plunger central axis 42 and the edge 40 of the crimping surface. To assemble the probe, the spring is fitted over the barrel and rests against the barrel flange 24. Alternatively, the spring is fitted over the plunger bearing and stem and rests on the plunger flange 28.

Figure 4:
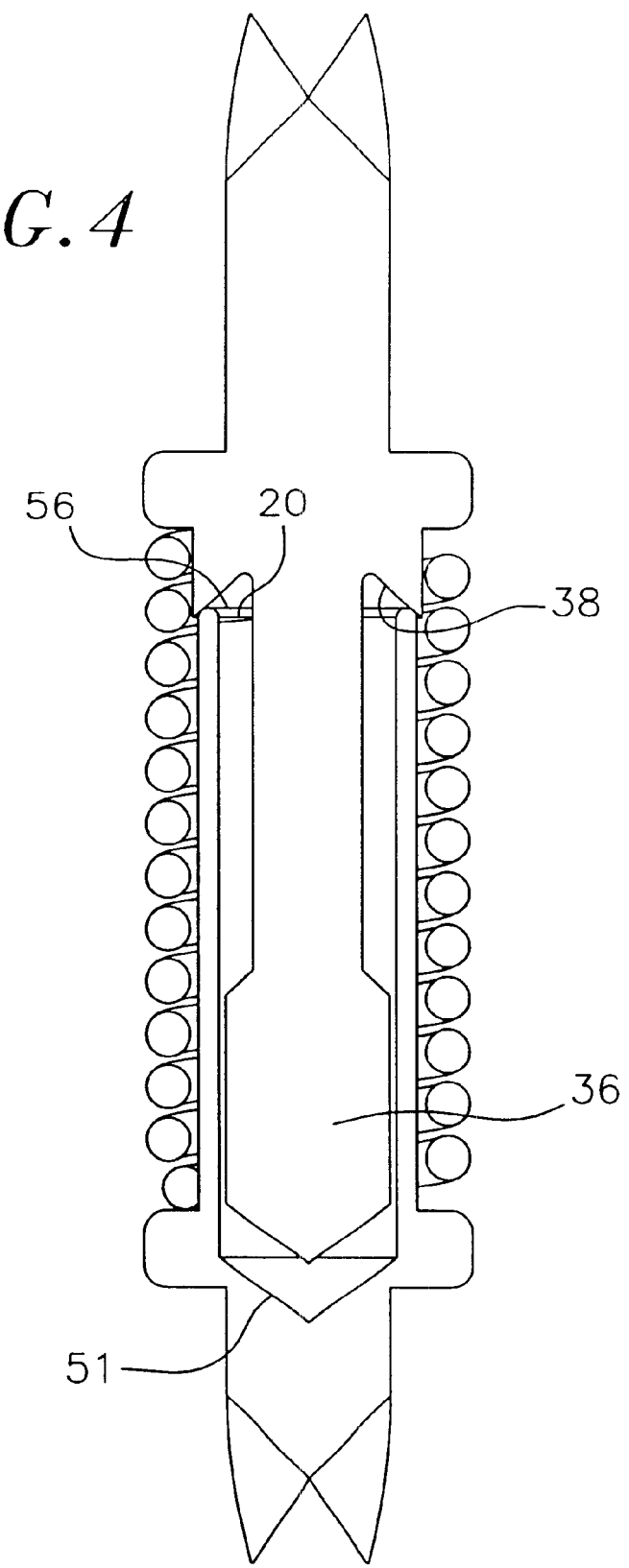
FIG. 4 is a cross-sectional view of the probe of the present invention with the open end of the barrel contacting the crimping surface prior to crimping.
Figure 5:
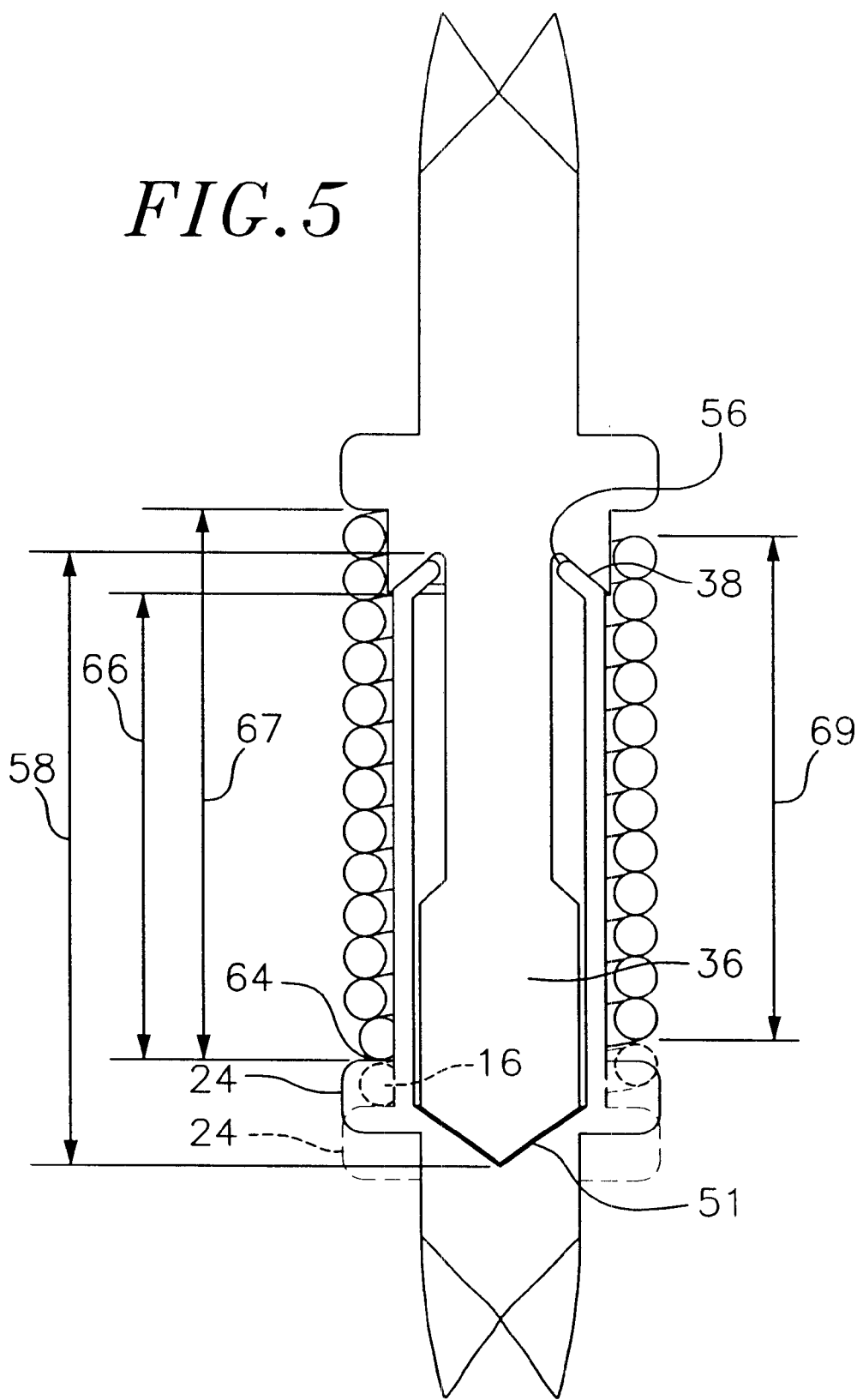
FIG. 5 is a cross-sectional view of the probe of the present invention with the plunger compressed against the barrel for crimping the barrel open end.

The plunger bearing is then slid into the barrel such that the spring 16 is sandwiched between the barrel flange 24 and the plunger flange 28. The barrel and plunger are moved toward each other such that the open end 20 of the barrel is engaged by the crimping surface 38 (FIG. 4). As the barrel and plunger are further pressed towards each other during the initial stroke, the edges 56 of the barrel open end are forced to bend or crimp radially inward by the crimping surface 38 (FIG. 5). Once the end of the barrel is crimped, it provides a barrier for retaining the bearing 36 within the barrel 18 as the plunger is biased by the spring from the barrel.

In the embodiment where the crimping surface is a frusto-conical surface (see FIGS. 2, 4 and 5), the frusto-conical crimping surface provides a radially inward force on the open end of the barrel as the barrel and plunger are compressed toward each other. The movement of the plunger toward the barrel is stopped when the bearing contacts the base surface 51 of the barrel. Thus, the combined length 58 of the stem and bearing as measured from the base of the stem beginning at the intersection between the stem and the crimping surface can be used to control the amount of crimping of the barrel end. For example, the shorter the combined length, the more crimping that will occur, i.e., a longer portion of the barrel end will be bent inwards. By selecting the appropriate combined stem and bearing length, the length of the bent portion of the barrel end can be controlled so as to not impinge on the stem. With the self-crimping probes of the present invention, the assembly of the probe is simplified and the time of assembly is reduced since separate tools are not required for compressing the spring nor are separate tools required for crimping the barrel end.

In an embodiment where the crimping surface does not span entirely around the plunger, the crimping surface will only crimp a portion of the barrel end. Preferably, opposite sections of the barrel should be crimped for retaining the bearing. This is achieved by having crimping surfaces extending opposite each other on the plunger.

Figure 7:
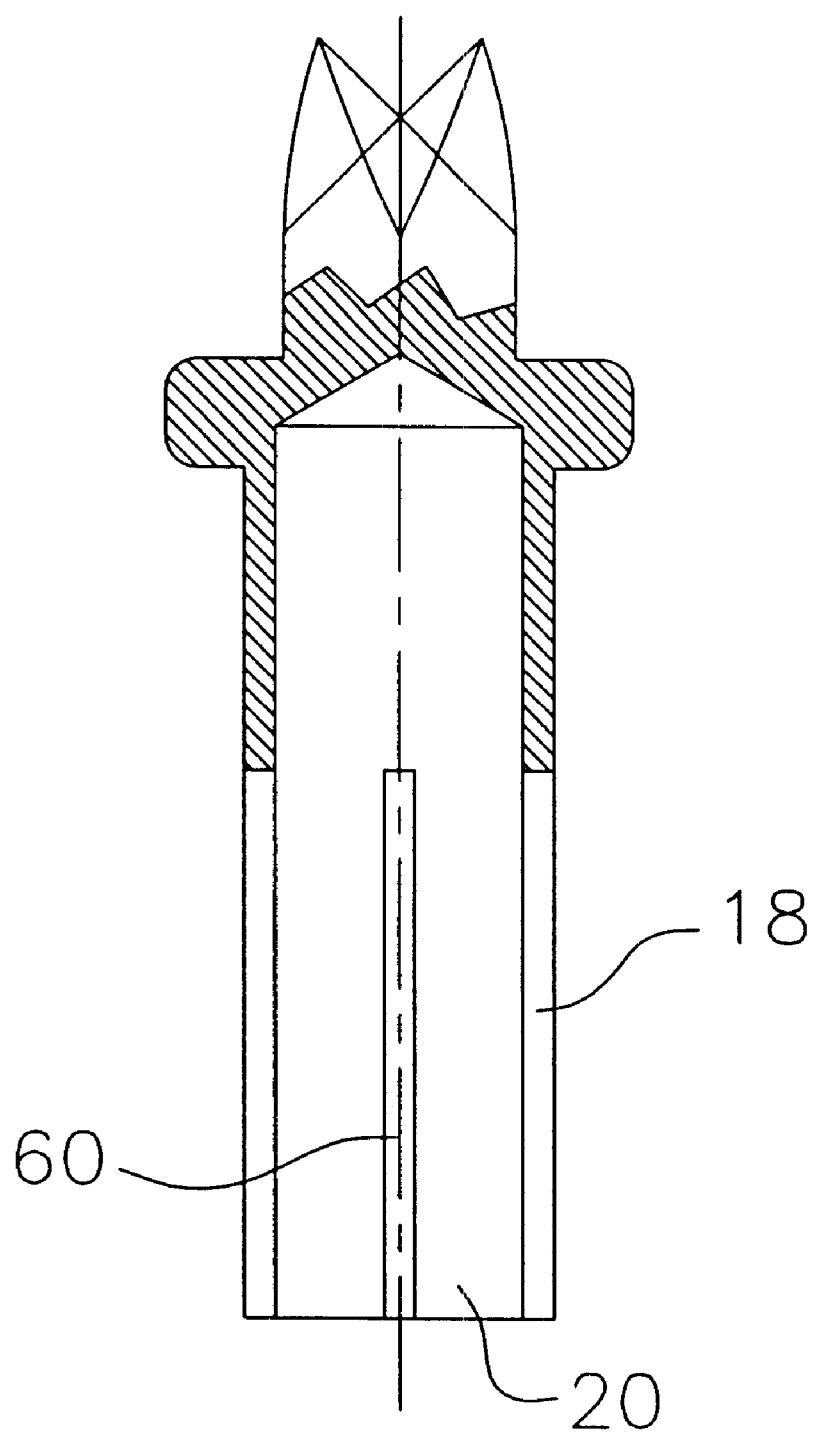
FIG. 7 is a cross-sectional view of the barrel of the present invention having longitudinal slits formed on the barrel open end prior to crimping.
Figure 8A:
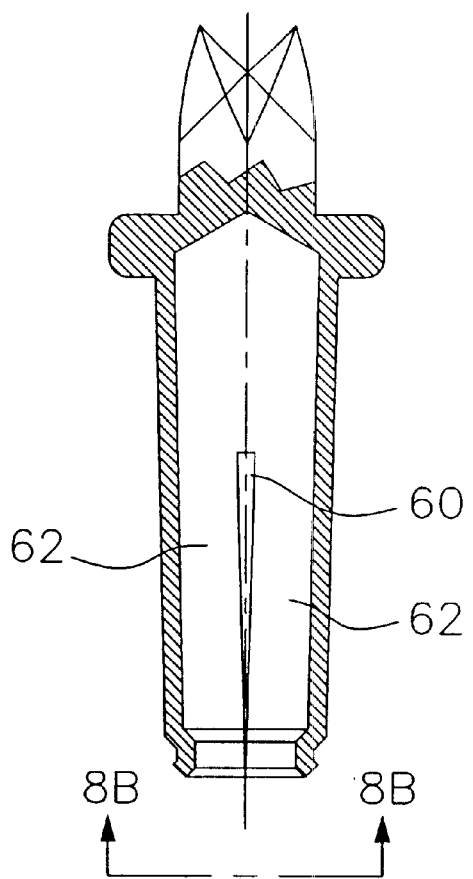
FIG. 8A is a cross-sectional view of a crimped barrel of the present invention having slits.
Figure 8B:
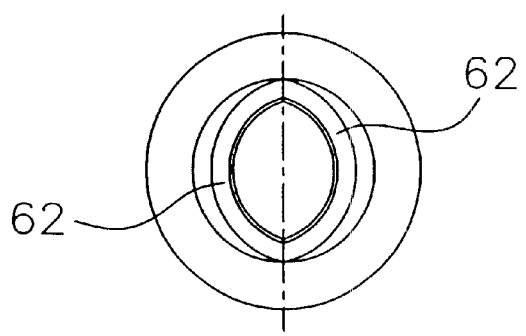
FIG. 8B is a bottom view of the barrel shown in FIG. 8A.

To aid in the crimping, longitudinal slits 60 may be formed along the barrel extending to the barrel end 20 as shown in FIG. 7. Two or more slits equidistantly spaced are preferred. The slits divide the barrel open end into sections 62 and also facilitate the radially inward crimping of the cylindrical barrel open end surface as shown in FIG. 8A. Moreover, when the barrel is slitted, the sections 62 of the barrel end between the slits can been bent toward each other, thereby narrowing the diameter of the barrel end 20 to a dimension smaller than the diameter of the bearing and thus provide a barrier for retaining the bearing within the barrel. These sections may also be crimped as shown in FIGS. 8A and 8B.

In an alternate embodiment, the barrel sections 62 are pre-bent inward and/or their ends are pre-bent (i.e., pre-crimped) inward prior to engagement with the bearing. At least one of the sections and preferably all of the sections 62 of the barrel open end defined between the slits are pre-bent inward and/or pre-crimped as shown in FIGS. 8A and 8B. The barrel end sections between the slits can flex. To assemble the probe, the bearing is pushed through the pre-bent and/or pre-crimped open end flexing the pre-bent and/or pre-crimped sections outward. When the bearing moves inside the barrel beyond the pre-bent and/or pre-crimped sections, the pre-bent and/or pre-crimped end sections flex back inward to their original pre-bent and/or pre-crimped position so that the pre-bent and/or pre-crimped end section(s) provides a barrier for retaining the bearing in the barrel. With this embodiment, the plunger bearing is "snapped" into position inside the barrel. Although it is preferable that all sections are pre-crimped and pre-bent, the invention can also be practiced with only one section pre-bent and/or pre-crimped inward.

Figure 12:
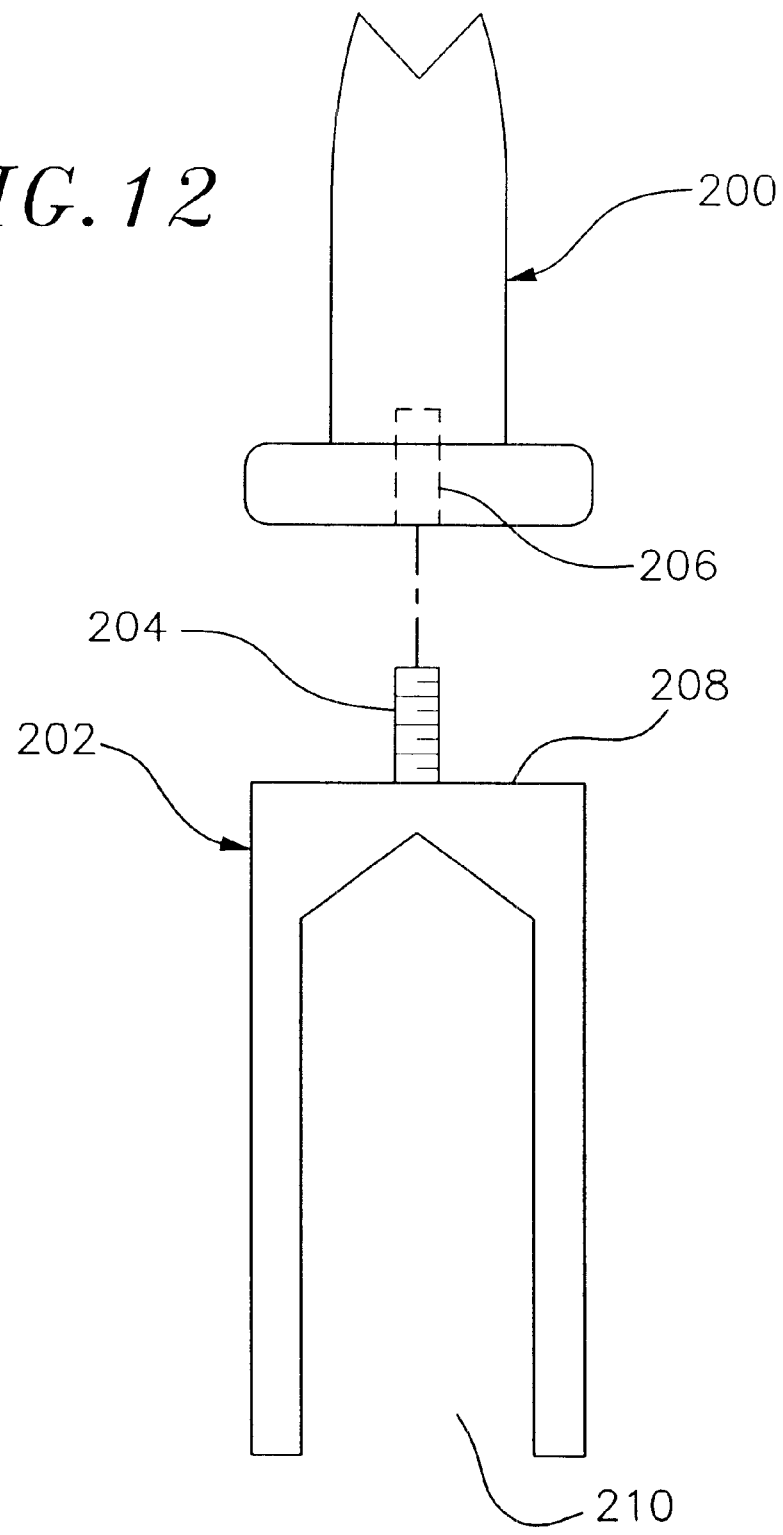
FIG. 12 is an exploded cross-sectional view of a barrel consisting of a hollow portion and a tip and flange portion.

In an alternate embodiment, the barrel or plunger of the probe may each comprise multiple portions. For example, the tip and flange of a barrel may form one portion 200 while the barrel hollow section may form a second portion 202 (FIG. 12). The barrel hollow portion may have a stud 204 extending from its end 208 opposite its open end 210. The tip and flange portion may have an axial opening 206 formed along the central axis of the flange and tip beginning at the flange and continuing into the tip. To form the barrel, the stud 204 is fitted into the opening 206. The stud may be threaded to the opening or it may be press fitted into the opening, or the tip and flange portion may be crimped after the stud is fitted into the opening causing the inner surface of the opening 206 to lock on the stud. Other methods of connecting the portions may also be used which do not incorporate the use of a stud protruding through the barrel hollow portion or an opening in the flange and tip portion.

Use of a multiple portion barrel or plunger allows for the spring to be fitted over the barrel and plunger after the barrel end is crimped. For example, the bearing of the plunger may be fitted into the barrel hollow portion through the hollow portion open end. The hollow portion open end is then crimped. A spring is then placed over the barrel hollow portion and is pushed against the flange of the plunger. The barrel tip and flange portion is then attached to the barrel hollow portion. Alternatively, a two portion plunger may be used where the plunger tip and flange form the first portion and the stem and bearing form the second portion. In such case, after the barrel open end is crimped retaining the plunger bearing, the spring is fitted over the plunger and barrel and is pushed against the barrel flange. The plunger tip and flange portion is then attached to the bearing and stem portion. Consequently, with these embodiments, the spring does not have to be compressed to expose the barrel open end to allow for crimping.

With the present invention, the spring length 67 when compressed (i.e., the spring solid height) may be longer than the length of the barrel as measured from the barrel flange surface 64 that supports the spring to the barrel open end. Moreover, the uncrimped length 66 of the barrel may be shorter than the length of the spring solid height 67 (FIG. 5). With conventional internal spring probes on the other hand, the fully compressed spring length must be shorter than the length of the barrel to accommodate the plunger bearing(s). Thus, with the present invention a shorter barrel length can be used for a given spring length. As such, a shorter probe may be used having a shorter electrical interconnect without decreasing the spring length. In addition, because the spring is external to the interconnect, for a given spring height, the spring is more voluminous then an internal spring because it has a larger spring diameter and therefore a longer wire length. Moreover, by moving a flange closer to its respective tip, as for example, by moving the flange 24 closer to the tip 22 of the barrel, as shown by the dashed lines in FIG. 5, a longer spring may be used further increasing the spring volume and thus, the spring operating life without decreasing the spring compliance. Similarly, moving a flange closer to its respective tip, allows the length of the probe to be shortened without decreasing the spring length and compliance.

To ensure that the bearing contacts the inner wall of the barrel so as to provide electrical conduit through the interconnect (i.e., the plunger and barrel) it is desirable that the probe is biased laterally, i.e., that a bending force is applied to the probe attempting to bend the probe along its length. In the present invention this is accomplished by using a spring whose ends are not squared off such that the length 67 of the spring along one side of the barrel is longer than the length 69 of the spring along an opposite side of the barrel (FIG. 5). This is achieved by using a spring which begins and ends at the same side of the barrel. In this regard the force applied on the plunger by the spring is greater on one side of the barrel (i.e., the side where the spring is longer) causing the plunger to extend along an axis skewed from the central of the barrel causing the bearing to maintain contact with the inner surface of the barrel.

Figure 6:
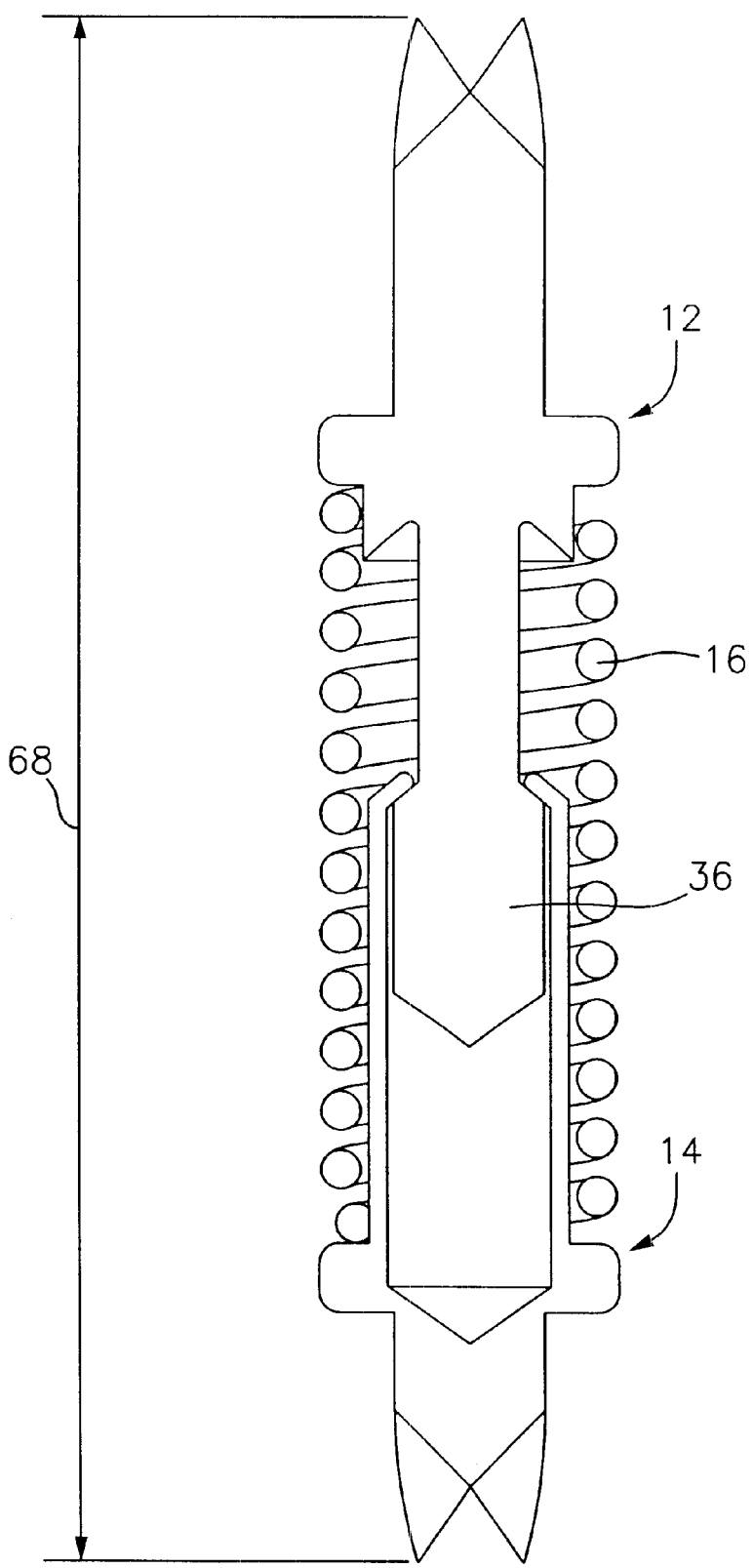
FIG. 6 is a cross-sectional view of the probe of the present invention with the plunger fully biased from the barrel by the spring.

An exemplary probe of the present invention has a length 68 when fully biased by the spring of about 0.13 inch as measured from the plunger tip to the barrel tip (FIG. 6). The length of the exemplary probe when filly compressed is 0.1 inch. The exemplary probe has a travel or compliance of about 0.030 inch between the barrel and plunger with a spring force of about 1 ounce at about 0.020 inch travel.

Figure 9:
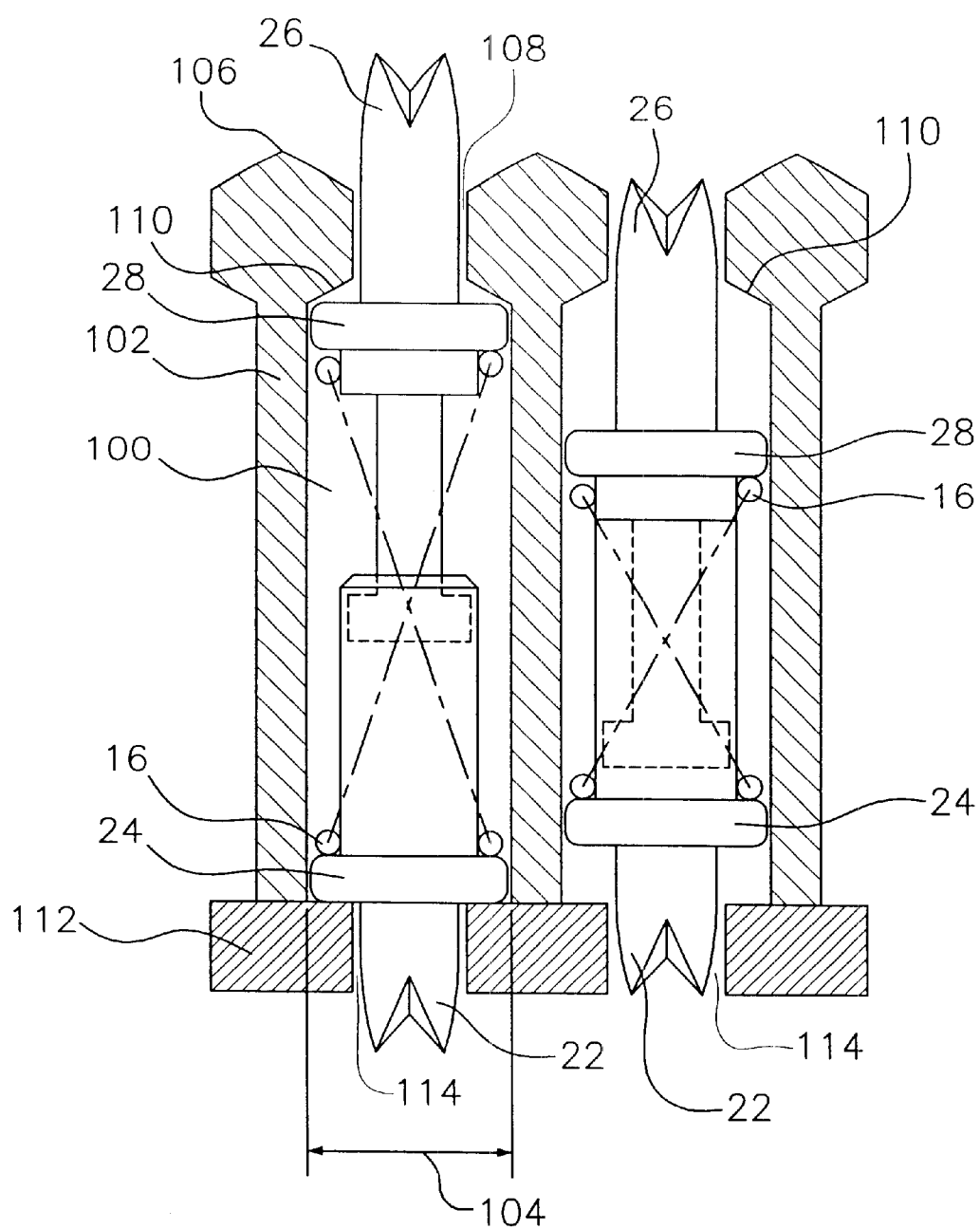
FIG. 9 is a cross-sectional view of a test socket section housing probes of an embodiment present invention.

The probes are typically fitted in cavities 100 defined in sockets (or test plates) 102 (FIG.9). These cavities have a diameter 104 to accommodate the probes with external springs. At an end face 106 of the socket, each cavity narrows to an opening 108 to allow for penetration by the probe tip. The narrowing of the cavities define shoulders 110 inside the cavities. Once the probes are inserted into the cavities their plunger flanges 28 engage the cavity shoulders 110 while their plunger tips 26 protrudes beyond the socket through openings 108. A cover plate 112 plate having openings 114 in the same pattern as the openings 108 on the test socket is mated to the test socket such that the barrel tips 22 of the probe protrude through the openings 114 of the cover plate. The openings formed on the cover plate have a diameter larger than the diameter of the tips but smaller than the outer diameter of the flanges. Thus, the cover plate engages the barrel flanges 24 when the probes are extended. Consequently, the sockets with cover plate may serve to limit the extension of the probes. The probes may also be mounted with their barrel tips 22 penetrating the socket openings 108 and their plunger tips 26 penetrating the cover plate openings 114.

Figure 10:
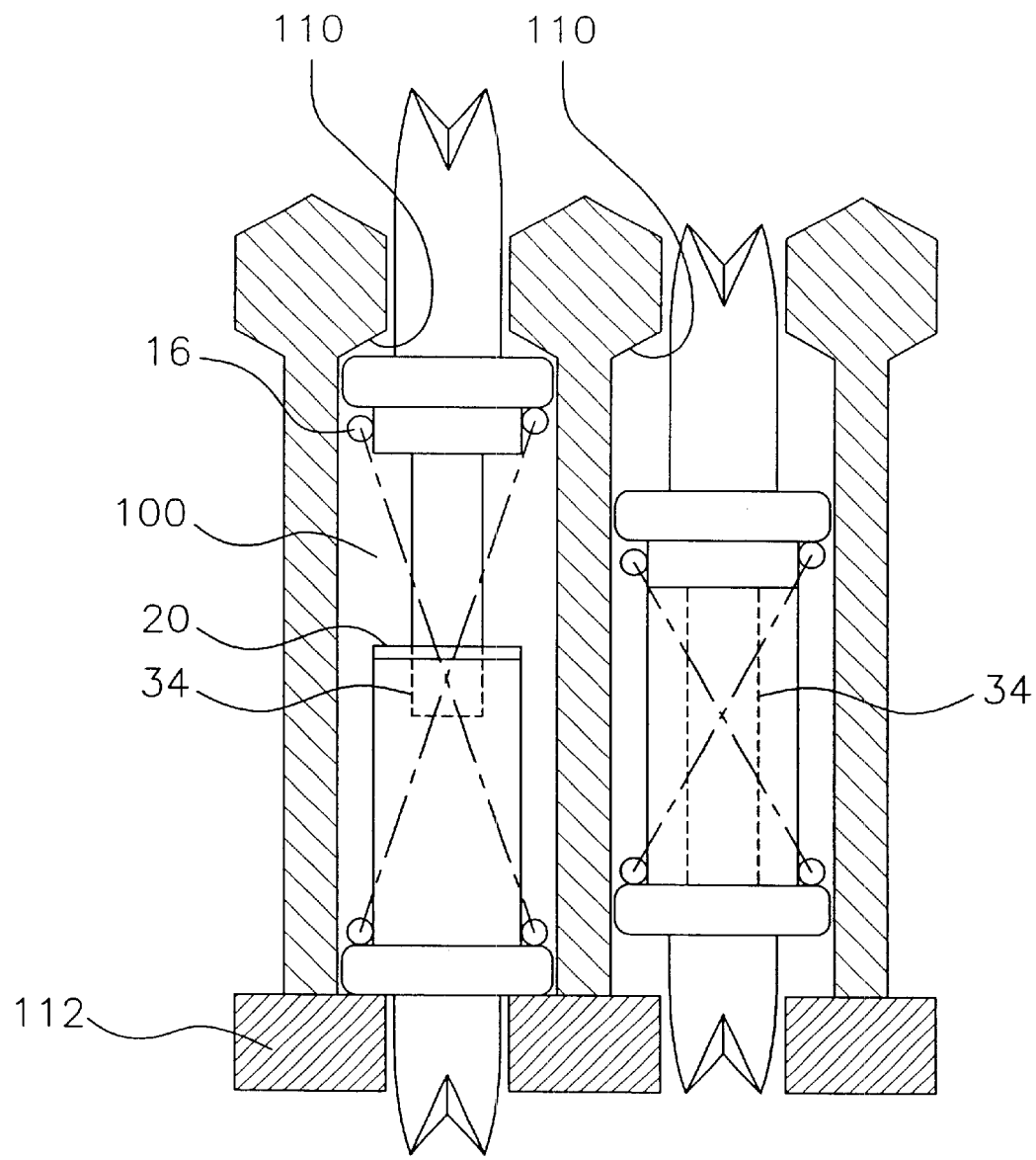
FIG. 10 is a cross-sectional view of a test socket section housing probes of another embodiment of the present invention.

With reference to FIG. 10, in a further embodiment, the probes of the present invention do not have their barrel ends 20 crimped. With this embodiment, each plunger is placed in a socket cavity 100. A spring 16 is then inserted over the plunger followed by a barrel which is pushed into the cavity to externally engage the plunger. The cover plate 112 is then mated to the socket. The shoulders 110 formed in the cavities and the cover plate 112 serve to keep the probe together. A probe of this embodiment does not require a separate bearing surface. Rather, the stem 34 can act as the bearing surface for bearing against the barrel inner walls (FIG. 10). With this embodiment, the diameter of the stem is slightly smaller than the inner diameter of the barrel.

Figure 11:
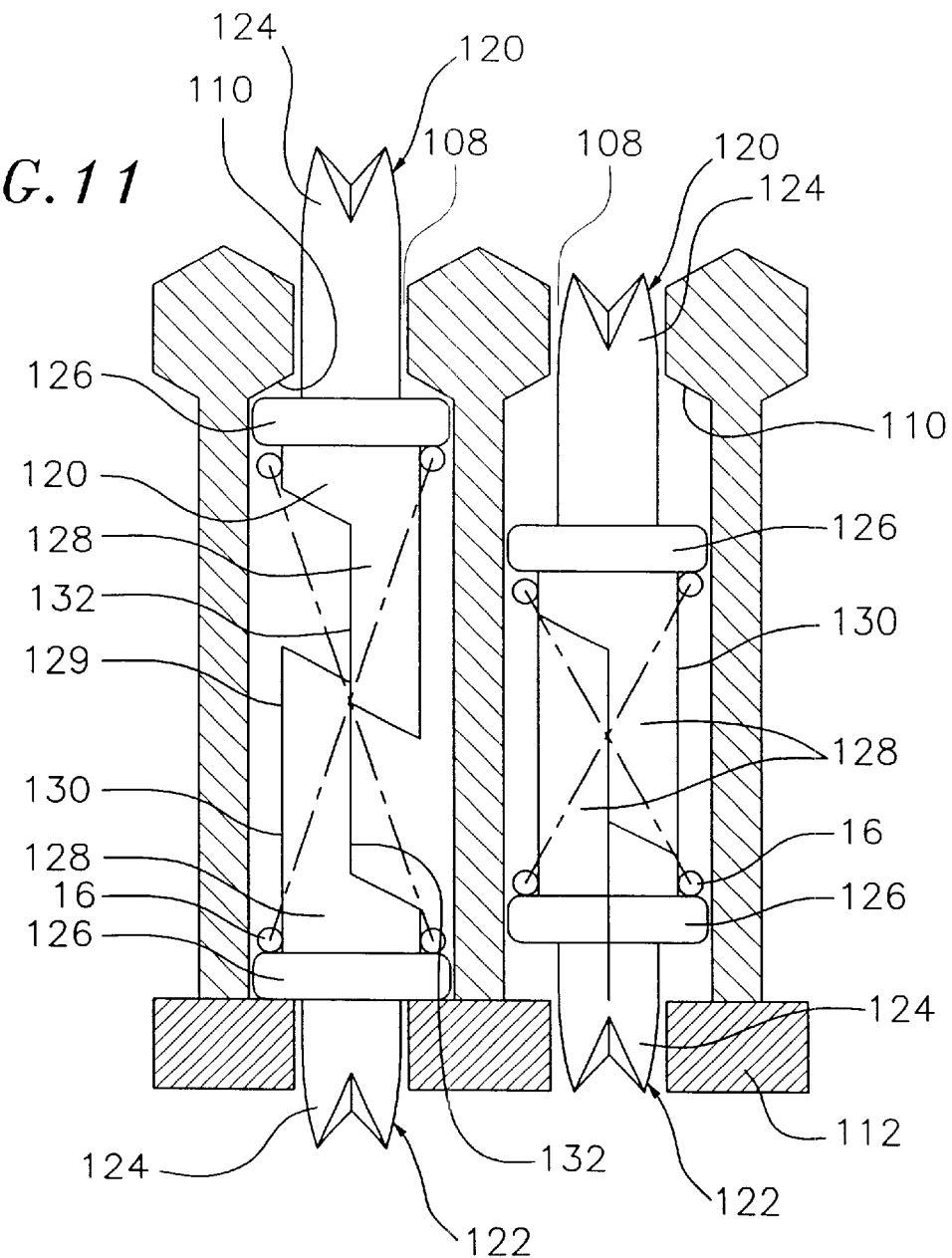
FIG. 11 is a cross-sectional view of a test socket section housing probes of a further embodiment of the present invention.

In yet a firther embodiment, the probe consists of a spring and two separate sections 120, 122 each having a tip 124 and a flange 126 (FIG. 11). A contact component 128, preferably having a semi-cylindrical portion 129, extends from each probe section opposite the tip 124. Each semi-cylindrical contact portion has a semi-cylindrical surface 130 and a flat surface 132. To form each probe, the first section 120 is placed in the socket cavity such that its tip 124 protrudes through the cavity opening 108. The spring 16 is then inserted over the contact component and rests against the flange 126. The second section 122 is then inserted into the cavity with its contact component first such that the flat surface 132 of the second section contact component semi-cylindrical portion mates with the flat surface 132 of the first section contact component semi-cylindrical portion. The spring is sandwiched between the two flanges. Once all probes are assembled in the cavities, the cover plate 112 is mated to the test socket such that the tips of the second sections protrude through the plate openings. The shoulder 110 formed in the cavities and the cover plate again serve to keep each probe together. As the probe extends and compresses the flat surface of the first section contact component remains in contact with the flat surface of the second section contact component so as to provide an electrical path between the two contact components. Other shapes of contact components may be used. For example, the contact component of each section may be cylindrical, or the contact component of the first section may be cylindrical, while the contact component of a second section may be flat. The contact components of the two sections forming a probe should maintain contact with each other so as to provide an electrical path between the two sections thus forming an electrical interconnect between the two sections. It is advantageous to form each probe using identical probe sections so as to simplify and reduce costs of probe manufacturing. To assist in the mating of the contact components, the contact surfaces of the two components should be complementary although not necessarily flat.

Figure 13:
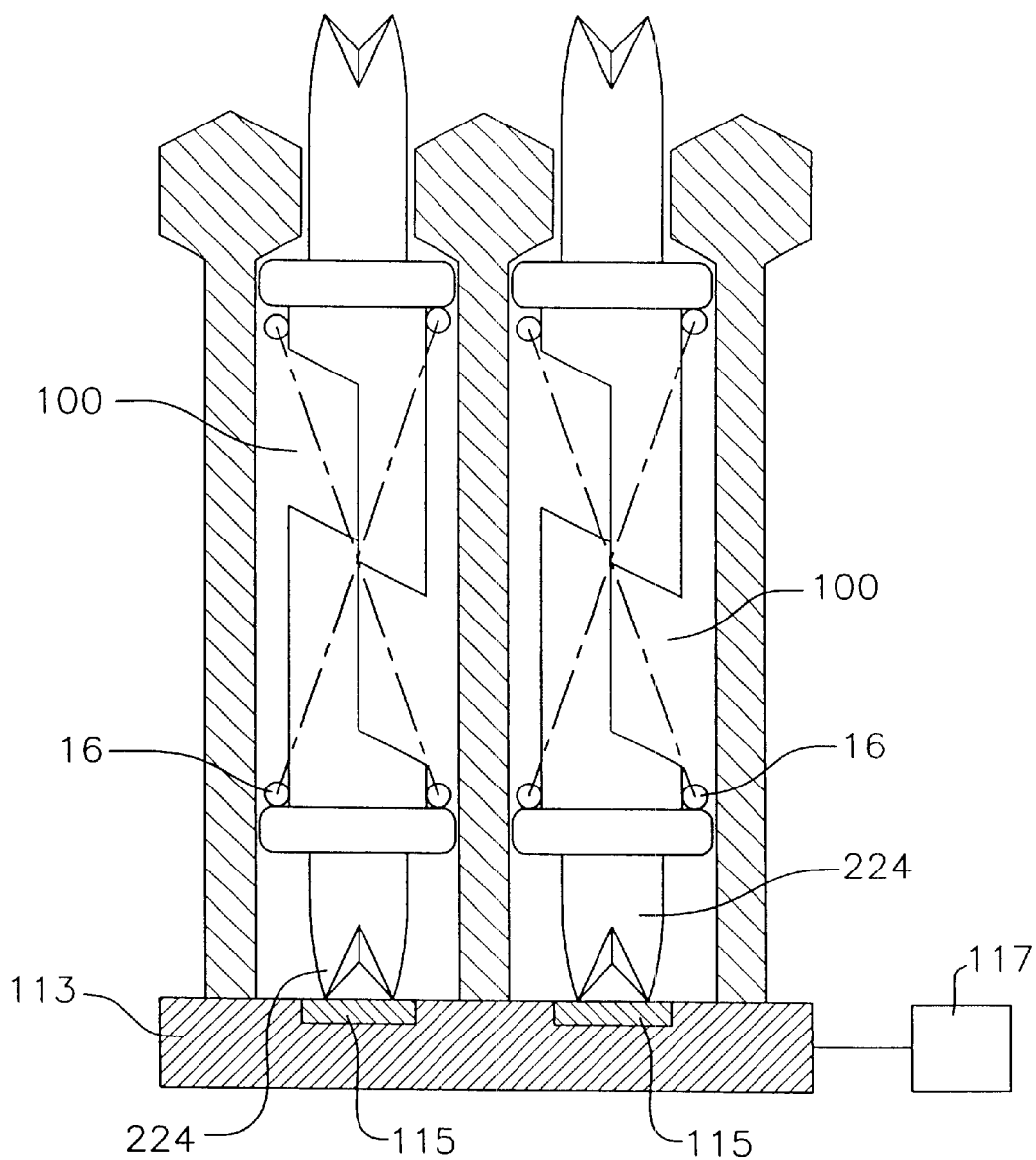
FIG. 13 is a cross-sectional view of a test socket housing probes of yet a further embodiment of the present invention.

Instead the cover plate 112, the contact plate (i.e., the circuit board) 113 which is coupled to the test equipment 117 may be used to cover the cavities 100. The contact plate has contact points 115 arranged in a pattern to come in contact with the probe section, plunger or barrel tips such as the tips 224 shown in FIG. 13. Instead of the contact plate or cover plate, the circuit board to be tested may be used to close off the cavities 100 such that the contact points on the circuit board to be tested come in contact with the probe tips.

Figure 14:
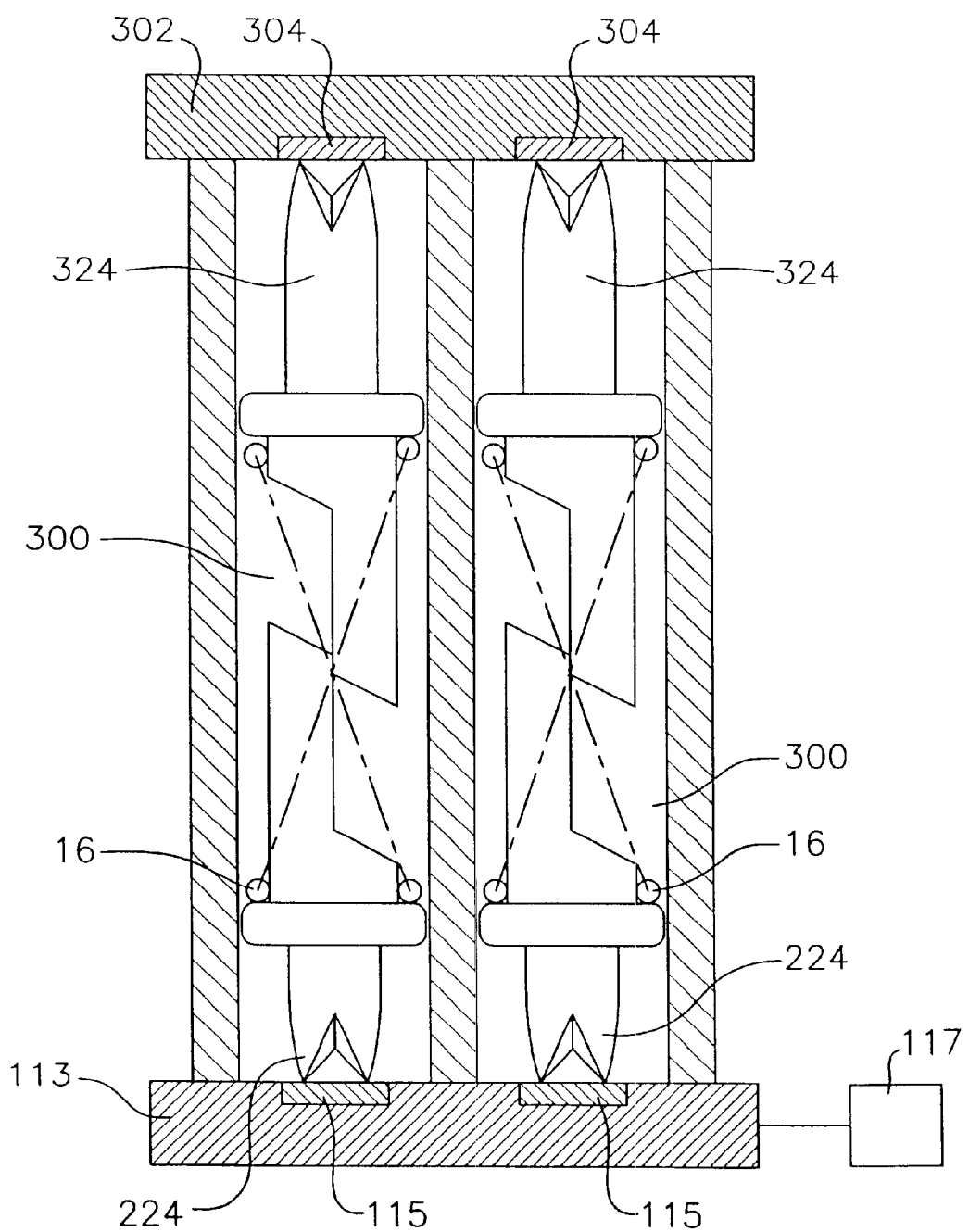
FIG. 14 is a cross-sectional view of a test socket housing probes of another embodiment of the present invention.

Furthermore, the socket may only have cylindrical cavities 300 as shown in FIG. 14. In such case, the circuit board to be tested 302 is mated to one side of the socket with its contact points 304 making contact with the probe tips 324. The contact plate 113 coupled to the test equipment 117 is mated to the opposite side of the socket whereby the circuit board and contact plate restrain the probes within the cavities.

As can be seen, all of the aforementioned probe embodiments allow for an increase in the spring volume without decreasing the spring compliance, and also allow for a decrease in the electrical interconnect length without decreasing the probe spring volume.

Although the present invention has been described and illustrated to respect to multiple embodiments thereof, it is to be understood that it is not to be so limited, since changes and modifications may be made therein which are within the full intended scope of this invention as hereinafter claimed.

What is claimed is:

1. A spring probe comprising:
   a barrel comprising,
      a body having an open end and a closed end and defining an opening extending from the open end to the closed end,
      a tip extending from the closed end, and
      a flange extending radially outward from the body;
   a plunger comprising,
      a tip at one end,
      a stem extending opposite of the tip, wherein the plunger tip and stem define a plunger body;
      a flange extending radially outward from the plunger body;
      a bearing portion extending from the stem opposite of the tip and slidably fitted within the barrel opening, wherein the bearing portion is wider than the stem, and
      a surface extending radially outward from the plunger body and toward the bearing for engaging the open end of the barrel and causing said end to bend radially inward for retaining the bearing portion in the barrel; and
   a spring sandwiched between the two flanges and surrounding the barrel biasing the barrel and plunger.

2. A probe as recited in claim 1 wherein the barrel further comprises at least one slit extending longitudinally toward the open end of the barrel for facilitating the inward bending of the open end.

3. A probe as recited in claim 1 wherein the surface extending radially outward from the plunger is an annular surface.

4. A probe as recited in claim 1 wherein the length of the spring when fully compressed is longer than the length of the barrel measured between the barrel flange and the barrel open end.

5. A probe as recited in claim 1 wherein the longitudinal length of the spring along one side of the spring is longer than along an opposite side of the spring for causing the plunger to extend at an angle relative to the barrel thereby causing the bearing to maintain contact with the barrel.

6. A spring probe as recited in claim 1 wherein the barrel, plunger and spring form a self-retained assembly wherein the plunger and barrel can extend and compress relative to each other and wherein the bearing portion is always retained within the barrel.

7. A spring probe comprising:
   a barrel having a hollow portion having an open end portion, said open end portion defining a terminal end of the barrel;
   a plunger having a first portion slidably engaging the hollow portion through the open end portion, the plunger having a second portion external of the barrel;
   a spring biasing the plunger and barrel; and
   means on the plunger for bending at least a portion of the barrel open end portion including the terminal end when the plunger is moved toward the barrel for retaining the first portion of the plunger within the barrel.

8. A probe as recited in claim 7 wherein the means is a surface extending radially outward from the second portion of the plunger for contacting and bending the at least a portion of the open end portion of the barrel inward.

9. A probe as recited in claim 8 wherein the means is an annular surface extending radially outward and toward the open end of the barrel.

10. A probe as recited in claim 7 wherein the spring is external to the barrel and plunger.

11. A probe as recited in claim 10 further comprising:
    a first flange extending outward from the barrel; and
    a second flange extending outward from the second portion of the plunger, wherein the spring is retained between the two flanges.

12. A probe as recited in claim 7 further comprising a slit formed on the barrel and extending to the barrel terminal end.

13. A probe as recited in claim 7 wherein the spring when fully compressed is longer than the length of the hollow portion of the barrel.

14. A probe as recited in claim 7 wherein the longitudinal length of the spring along one side of the spring is longer than the length along an opposite side of the spring for causing the plunger to extend at an angle relative to the barrel thereby causing the bearing to maintain contact with the barrel.

15. A self closing spring probe comprising a barrel, a plunger at least partially extending into the barrel, and spring biasing the plunger from the barrel, wherein the plunger includes a crimping surface for crimping an open end of the barrel inward during the initial compression stroke of the plunger.

16. A self closing probe as recited in claim 15 the spring surrounds at least a portion of the barrel for biasing the barrel and the plunger, wherein when fully compressed the spring surrounds the barrel open end after being crimped by said crimping surface.

17. A self closing probe as recited in claim 15 the spring surrounds at least a portion of the barrel, wherein the longitudinal length of the spring along one side of the spring is longer than along an opposite side of the spring for causing the plunger to extend at an angle relative to the barrel thereby causing the bearing to maintain contact with the barrel.

18. A self closing probe as recited in claim 15 wherein the plunger comprises a tip portion, wherein said tip portion is separable from said plunger.

19. A self closing probe as recited in claim 15 wherein the barrel comprises a tip portion, wherein said tip portion is separable from the barrel.

20. A self closing spring probe as recited in claim 15 wherein when crimped, the open end of the barrel retains at least a portion of the plunger within the barrel.

* * * * *